United States Patent
Pokharna et al.

(12) 
(10) Patent No.: US 6,358,327 B1
(45) Date of Patent: *Mar. 19, 2002

(54) METHOD FOR ENDPOINT DETECTION USING THROTTLE VALVE POSITION

(75) Inventors: Himanshu Pokharna, Santa Clara; Chen-An Chen, Sunnyvale; West M. Burghardt, Belmont, all of CA (US); Reuban Richmonds, Royal Oak, MI (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/342,667

(22) Filed: Jun. 29, 1999

(51) Int. Cl.[7] .......................... B08B 9/00; H01L 21/306
(52) U.S. Cl. .......................... 134/18; 134/1.1; 134/42; 216/59; 438/5; 438/14; 438/905
(58) Field of Search ................. 134/1.1, 22.1, 134/18, 42; 216/59; 438/5, 14, 905

(56) References Cited

U.S. PATENT DOCUMENTS 5,812,403 A * 9/1998 Fong et al. .................. 134/1.1
6,017,414 A * 1/2000 Koemtzopoulos et al. ... 134/1.1
6,079,426 A * 6/2000 Subrahmanyam et al. ... 134/1.1
6,170,492 B1 * 1/2001 Ueda et al. .................. 134/1.1
6,192,898 B1 * 2/2001 Itani et al. .................. 134/1.1

* cited by examiner

Primary Examiner—Randy Gulakowski
Assistant Examiner—Saeed T. Chaudhry
(74) Attorney, Agent, or Firm—Dugan & Dugan

(57) ABSTRACT

A method and apparatus for endpoint detection is provided. Endpoint is determined by monitoring throttle valve position during a production instance of a given process, and by comparing a production signal obtained thereby with a calibration signal previously obtained by monitoring throttle valve position during performance of the process on a chamber or on a wafer of known constitution. The production process endpoint may be set based on the endpoint time of the calibration signal, or may be determined by filtering the calibration signal and the production signal to identify features thereof and by comparing the pattern of features of the production signal with the pattern of features of the calibration signal. Preferably throttle valve positions are filtered using a low pass finite impulse response filter of order three.

11 Claims, 6 Drawing Sheets

METHOD FOR ENDPOINT DETECTION USING THROTTLE VALVE POSITION

FIELD OF THE INVENTION

The present invention relates generally to semiconductor processing. More particularly, the present invention relates to a method for determining the endpoint of a process performed within a processing chamber.

BACKGROUND OF THE INVENTION

In the field of integrated circuit and flat panel display fabrication, multiple deposition and etching processes are performed in sequence on a substrate within one or more processing chambers to form various design structures. Processes such as physical vapor deposition (PVD), chemical vapor deposition (CVD), etching, etc., are well known in the industry and each result in residue build up in the processing chamber. For example, during CVD, silicon oxide or silicon nitride materials are deposited on all exposed surfaces of the CVD deposition chamber, as well as on the substrate. Typically, when such residues accumulate to a thickness of about 0.5 to 10 microns, the residues must be removed from the chamber surfaces prior to subsequent deposition processes. Otherwise, the residue material may flake from chamber surfaces, and may deposit on a substrate, compromising the integrity of features formed thereon.

Conventionally, deposition chambers are cleaned to remove residue using a plasma and select chemical compounds which react with the residue and form a volatile compound which can be exhausted from the chamber. Alternatively or additionally, the chemical compounds may form etching species which bombard the chamber surfaces to dislodge residue from the chamber components.

When a chamber cleaning operation is performed, semiconductor device production is interrupted and as a result, the effective productivity of the chamber, as measured by substrate throughput, decreases significantly. In order to increase chamber productivity, it is necessary to minimize cleaning operation time and to restart device production immediately thereafter. Therefore, it is imperative to determine precisely the endpoint of the cleaning process.

Because the time required for processing and cleaning determines production capabilities, semiconductor device manufacturers carefully monitor processing time relative to cleaning time. Accordingly, there is a need for an accurate and consistent determination of the endpoint of a process (whether a production process or a cleaning process). Preferably, the determination should be made using existing hardware and monitors.

SUMMARY OF THE INVENTION

The invention generally provides a method and apparatus for detecting the endpoint of a process by monitoring the position of a valve during the process. The inventive method allows endpoint detection for any process that requires throttle valve position changes in order to maintain chamber pressure within a desired range, and is particularly well suited for detecting the endpoint of a chamber cleaning process.

For instance, a remote microwave chamber cleaning process's optimal chamber pressure is typically about 1.5 Torr. As chamber surfaces are cleaned via vaporization (e.g., etchant induced desorption) of material deposited thereon, the chamber's throttle valve opens so that the vaporized material does not increase chamber pressure. As the cleaning process progresses less material vaporizes, the throttle valve position changes less, and eventually the throttle valve reaches a final constant position indicative of a clean chamber.

Each process has a unique pattern of throttle valve positions. Accordingly, to obtain a calibration signal the inventive method monitors throttle valve position while a given process is performed within a specific chamber to obtain a calibration signal for that chamber and for the given process (e.g., to obtain a calibration signal for a wafer processing process such as an etching process or a chamber processing process such as a cleaning process). A production instance of the process is then performed within the specific chamber, and the calibration signal is used to estimate the endpoint of the production process. The endpoint of the production process may be estimated by:

(1) equating the time at which the calibration signal indicates endpoint (i.e., the endpoint time (t)) with the endpoint of the production process; or
(2) filtering the calibration signal, monitoring the production process' throttle valve position to obtain a production signal, filtering the production signal and comparing the features of the filtered production signal with the features of the filtered calibration signal.

Both the calibration signal and the production signal may be filtered by first determining a slope for each measured throttle valve position, and by then filtering the determined slopes (e.g., via a finite response filter). Thereafter, features may be identified by determining the sign (i.e., positive, negative or zero) of each filtered slope, by determining the duration of consecutive filtered slopes of like sign, and by defining a minimum duration of consecutive filtered slopes of like sign to identify features (e.g., five or more consecutive positive filtered slopes equals a positive feature).

The endpoint of the production process may be estimated, for example, to occur when the number, order and sign of the filtered productions signal's features equal the number, order and sign of the filtered calibration signal's features. When endpoint is estimated by either the first or the second method, it may be desirable to continue production processing for a period of time beyond the estimated endpoint time (i.e., for a total production processing time of t+N), to ensure that the endpoint has been reached.

An inventive computer program product for performing the endpoint detection process comprises a computer readable medium having means for storing a calibration signal comprising throttle valve positions for a given process (i.e., a throttle valve position calibration signal or a "calibration signal"), and means for directing a controller to end a production instance of the process based on the calibration signal. The inventive program also may include means for monitoring the position of a throttle valve during performance of the production instance of the process (e.g., to generate a throttle valve position production signal or a "production signal"), means for filtering the calibration signal and the production signal, means for identifying features of the filtered calibration signal and of the filtered production signal, and means for comparing filtered production signal features with filtered calibration signal features to estimate the endpoint of the production process. Preferably the production signal is filtered via use of a low pass filter, most preferably via use of a low pass finite impulse response filter of order three.

With use of the inventive method and apparatus, processing endpoints may be determined with no additional hardware cost. Existing hardware may be used to monitor throttle valve position, to terminate a process and to store data and perform computations thereon. Further, the inventive endpoint detection method can be performed in real time, such that a process can be terminated precisely at its endpoint. Chamber productivity therefore is maximized.

DETAILED DESCRIPTION OF THE PREFERRED EMBODIMENT

Figure 1:
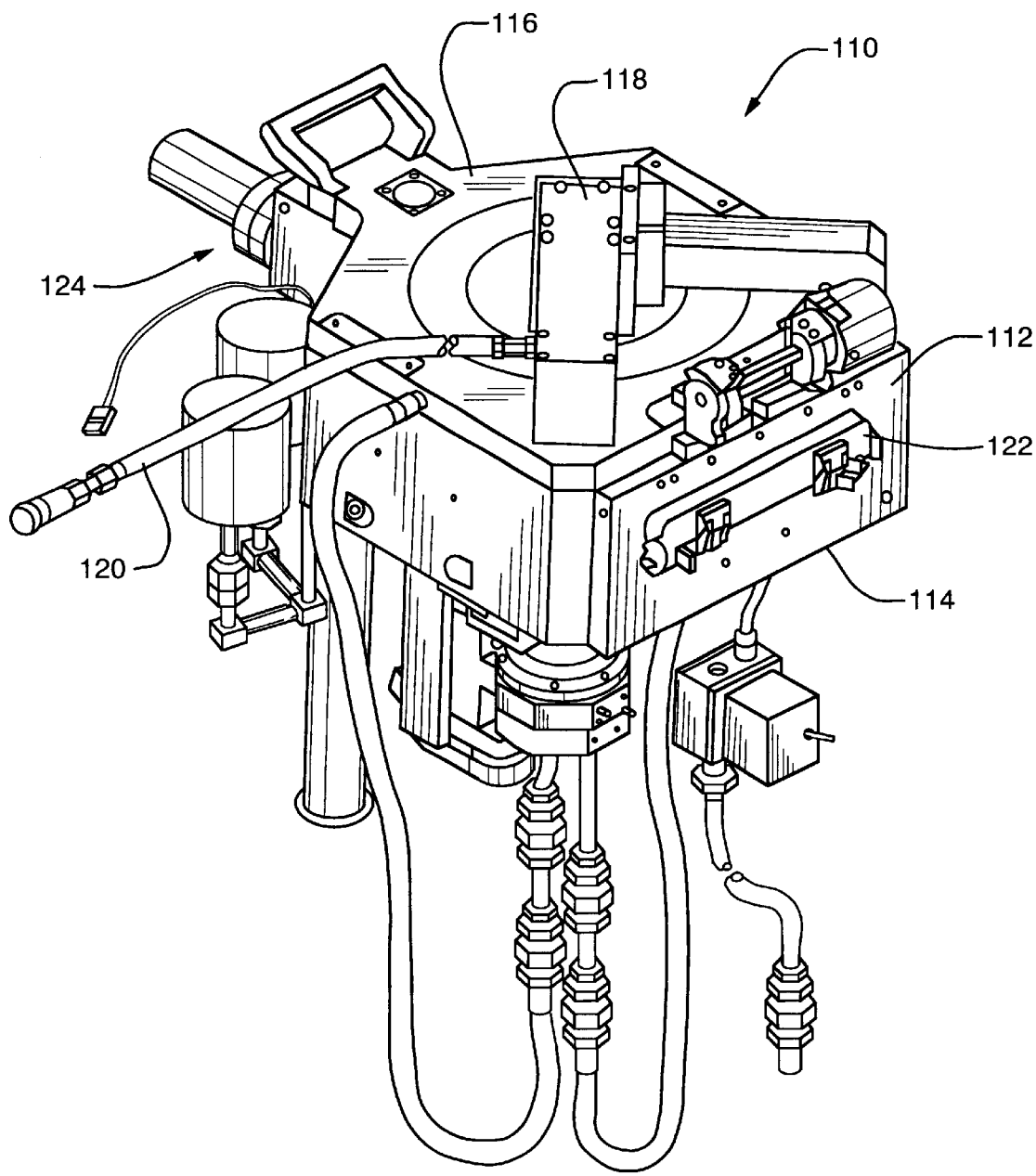
FIG. 1 is a substantially top perspective view of a deposition chamber configured in accordance with the present invention.

FIG. 1 is a substantially top perspective view of a deposition chamber 110 configured in accordance with the present invention. One chamber which can benefit from the advantages of the invention is the Giga-Fill CxZ Chamber, available from Applied Materials, Inc., located in Santa Clara, Calif. The chamber 110 includes a sidewall 112, a bottom 114 and a lid 116 which delivers the processing gases into the chamber. The lid 116 typically is hingedly mounted to the top of the sidewall 112 to allow the lid to be opened and closed. The lid 116 forms a vacuum seal with the sidewall 112 when closed.

A gas distribution system 118 is mounted to the lid 116 and is connected to a gas supply 210 (FIG. 2) via a remote plasma generator 212 (FIG. 2) and a gas line 120 to deliver processing gases into the chamber 110. The gas distribution system 118 also includes mass flow controllers (not shown) and air operated valves (not shown) to control the flow of process gases into the deposition chamber 110. Preferably, separate gas supplies are connected to the gas distribution system 118 for processing and cleaning.

Processing gases typically are delivered through a showerhead arrangement or gas distributor 214 (FIG. 2) disposed in the central portion of the lid 116. A slit valve 122 is disposed on the sidewall 112 to allow transfer of substrates or wafers into and out of the processing chamber 110. A pressure control system 124 is connected to the sidewall 112 to adjust the pressure within the chamber 110 for various processing needs. The pressure control system 124 preferably comprises a throttle valve 216, a foreline isolation valve 218 and a capacitance manometer 220 (as shown in FIGS. 2 and 3).

Figure 2:
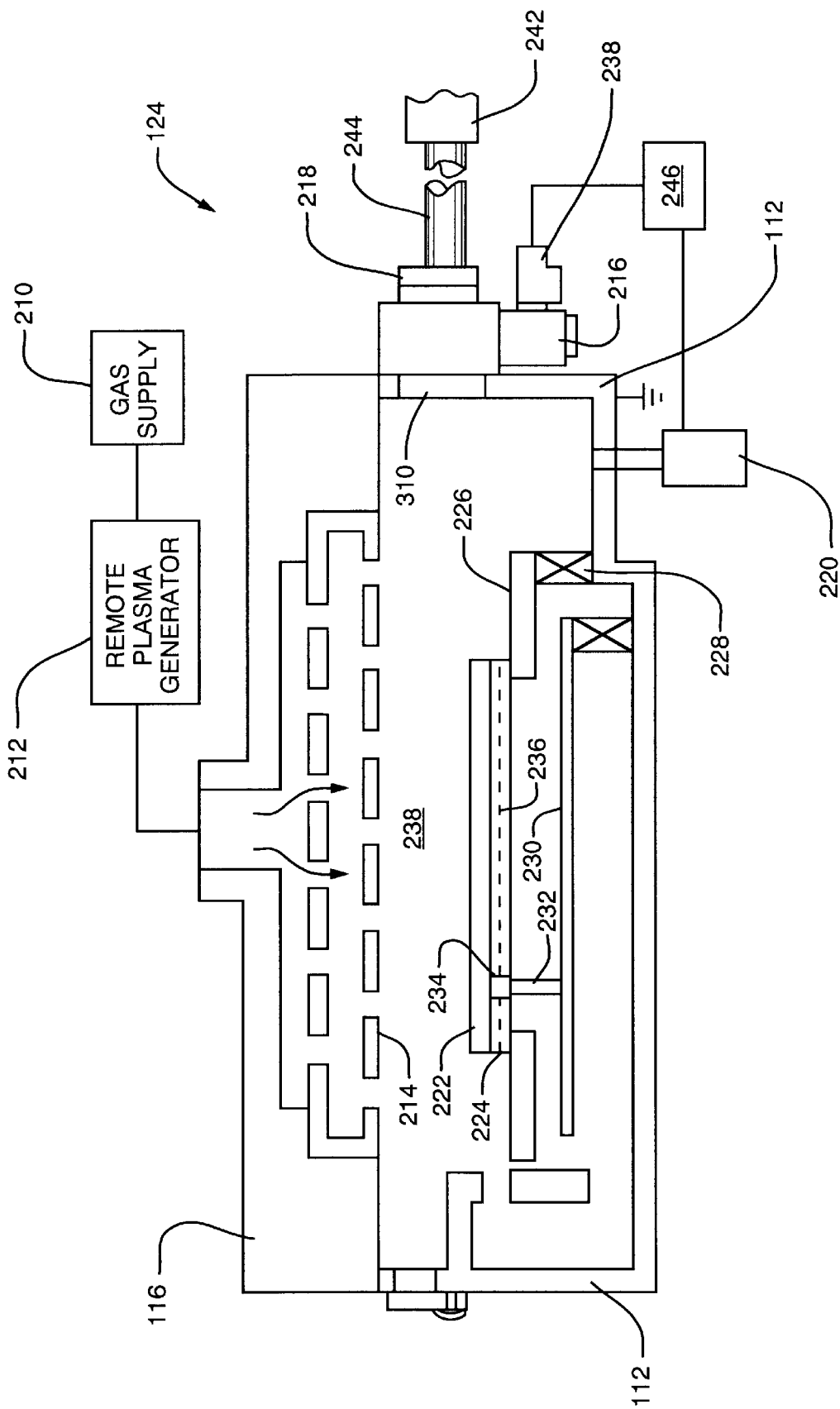
FIG. 2 is a simplified cross-sectional schematic view of the deposition chamber of FIG. 1.
Figure 3:
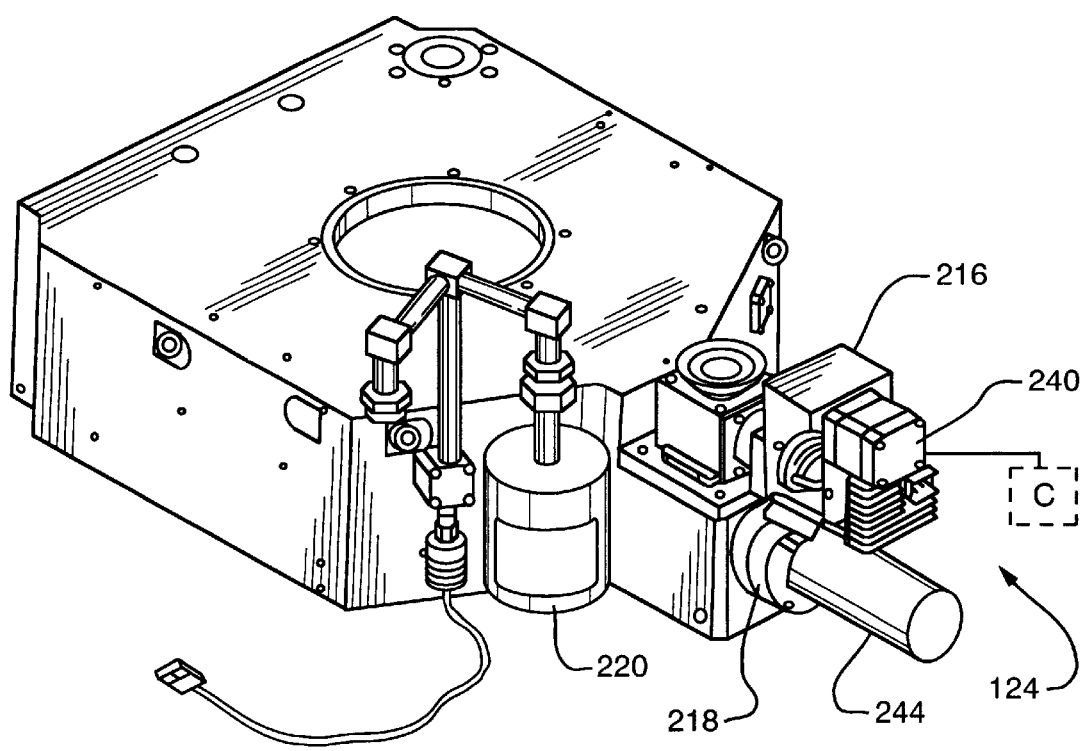
FIG. 3 is a partial bottom perspective view of the deposition chamber of FIG. 1.

FIG. 2 is a simplified cross-sectional view of the deposition chamber 110 of FIG. 1. As shown in FIG. 2, the process gas distributor 214 for distributing and delivering process gases into the chamber 110 is disposed within the lid 116 and is positioned directly above a substrate 222 positioned on a substrate support 224.

The substrate 222 is introduced into the chamber 110 through the slit valve 122 on the sidewall 112 of the chamber 110 and is placed on the substrate support 224. The substrate support 224 is disposed on a support lift assembly 226 that includes a support lift actuator 228 to adjust the gap between the substrate 222 and the gas distributor 214. To facilitate transport of the substrate 222 into and out of the chamber 110, a lift finger assembly 230 (comprising a plurality of lift fingers 232 that move through bores 234 in the substrate support 224) lifts the substrate 222 from and lowers the substrate 222 onto the substrate support 224. A thermal heater 236 disposed within the substrate support 224 is provided to rapidly heat the substrate 222 to a desire processing temperature. Rapid heating and cooling of the substrate 222 is preferred to increase processing throughput, and to allow rapid cycling between successive processes operated at different temperatures within the same chamber 110.

The substrate 222 is processed in a process zone 238 between the substrate support 224 and the gas distributor 214. Once processing is complete, the substrate 222 is transported out of the chamber 110 through the slit valve 122, and a chamber cleaning process is performed.

The remote microwave plasma generator 212 is connected to the gas supply 210 (as described) so as to generate a plasma and so as to deliver reactive gas radicals into the process zone 238 of the chamber 110 during chamber cleaning.

Generally, the chamber cleaning process comprises introducing radicals of one or more cleaning gases into the chamber 110 via the remote plasma generator 212 and exhausting from the chamber 110 contaminants and byproducts generated by reactions with the cleaning gases.

FIG. 3 is a partial bottom perspective view of the deposition chamber 110 of FIGS. 1 and 2. Referring to FIGS. 2 and 3, the pressure control system 124 is connected to the sidewall 112 through an exhaust passage 310 to enable monitoring and adjusting of the pressure within the chamber 110 for various processing needs. As previously stated, the pressure control system 124 preferably comprises the throttle valve 216, the foreline isolation valve 218 and the capacitance manometer 220. The capacitance manometer 220 monitors chamber pressure, as is known in the art. Preferably, the throttle valve 216 is a dual spring throttle valve driven by a stepper motor 240 to regulate the exhaust rate of gas from the chamber. The throttle valve 216 preferably includes a sleeve having a Teflon-coated interior and a rotating drum or a butterfly valve therein. A vacuum pump 242, such as a rotary vane vacuum pump, is connected to the pressure control system 124 through a vacuum conduit 244 so as to enable evacuation of chamber gases. Typically, the vacuum pump 242 is capable of achieving a minimum vacuum of about 10 mTorr.

During processing the chamber 110 typically is maintained at a constant vacuum pressure. For example, during the preferred chamber cleaning process (described below) the chamber pressure is maintained at about 1.5 Torr. This pressure value preferably is maintained via a controller 246, comprising a memory and a microprocessor (not shown), connected to the pressure control system 124 that regulates the position of the throttle valve 216 to control the exhaust rate of the gas from the chamber 110. Specifically, the stepper motor 240 is electrically connected to and is controlled by the controller 246 which receives from the capacitance manometer 220 a signal indicative of chamber pressure.

Typically during chamber cleaning, the throttle valve 216 initially is in a fully opened position to allow contaminants (e.g., vaporized deposition residue) to be pumped from the chamber with the cleaning gas while the required chamber pressure is maintained (e.g., because of the large amount of vaporized deposition residue within the chamber 110, the chamber pressure remains at about 1.5 Torr despite the throttle valve 216 being fully opened). As the cleaning process proceeds, the chamber 110 becomes cleaner and fewer contaminants are removed from the interior surfaces of the chamber 110 and the amount of vaporized deposition residue within the chamber 110 decreases. To maintain a constant chamber pressure as the amount of vaporized deposition residue within the chamber 110 decreases, the stepper motor 240 gradually closes the throttle valve 216.

Figure 4:
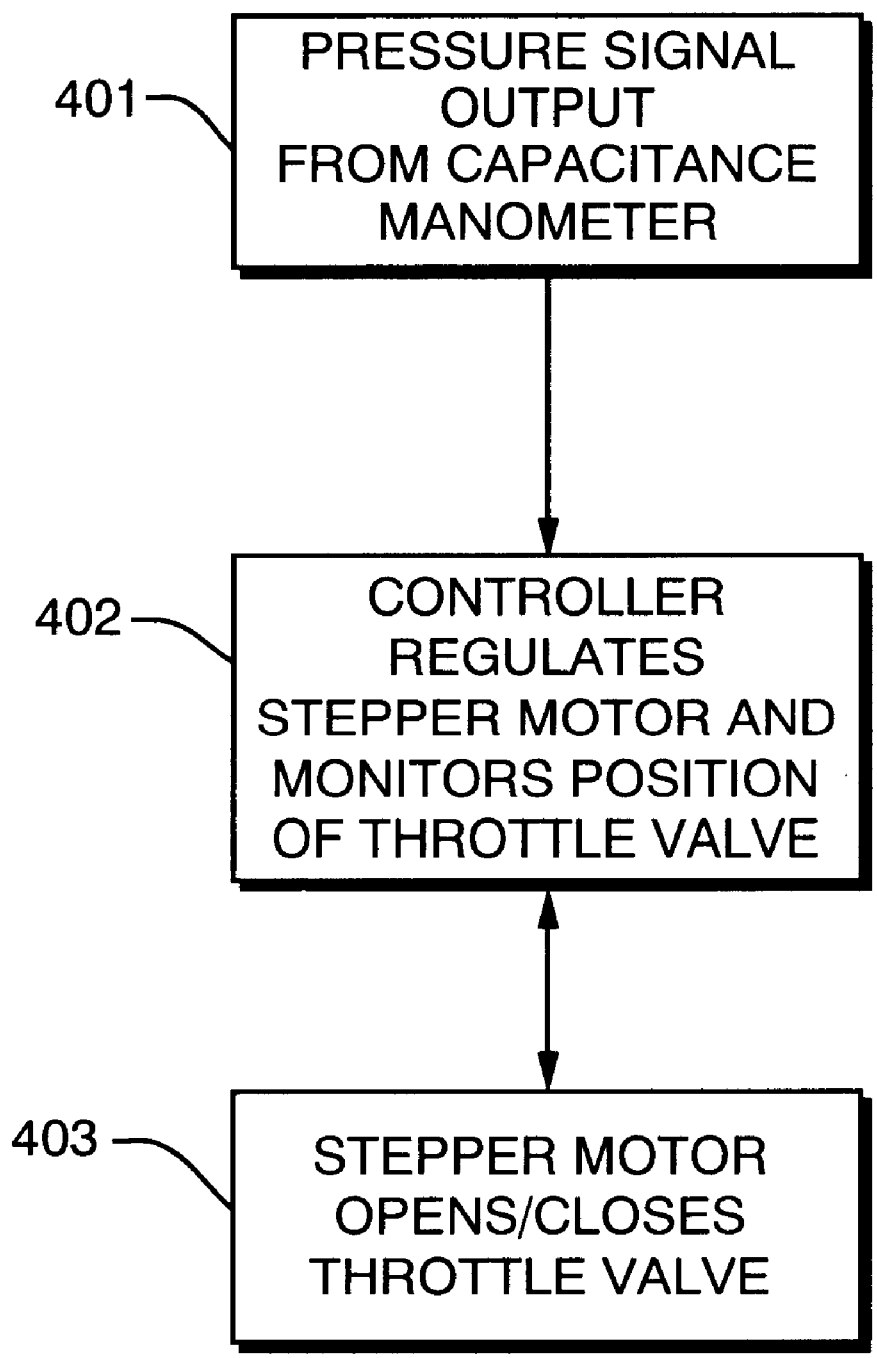
FIG. 4 is a flow diagram illustrating the signal flow to and from a controller of the deposition chamber of FIGS. 1–3.

FIG. 4 is a flow diagram illustrating the signal flow to and from the controller 246 of the invention. To have the most efficient cleaning, the pressure within the chamber 110 must remain approximately constant. The desired pressure within the chamber 110 is set and maintained by the controller 246 which receives (STEP 401) a signal corresponding to the chamber pressure as measured by the capacitance manometer 220. In response thereto, the controller 246 sends signals to the stepper motor 240 (STEP 402) to open/close the throttle valve 216 (e.g., by stepping the stepper motor 240 forward/backward) so as to maintain the desired chamber pressure (STEP 403). The controller 246 preferably also monitors the position of the throttle valve 216 (STEP 402) to determine the endpoint of the cleaning process in accordance with the present invention (as described in detail with reference to the flowchart of FIGS. 5A and 5B).

An exemplary cleaning operation wherein the tungsten is cleaned from the surfaces of the chamber 110 is now described. To clean tungsten from the surfaces of the chamber 110, a cleaning gas, preferably nitrogen trifluoride ($NF_3$), is supplied to the chamber 110 through the gas distribution system 118 at a selected flow rate, preferably between about 100 sccm and about 2000 sccm, even more preferably at about 950 sccm. During cleaning, the remote microwave plasma generator 212 generates a plasma from the cleaning gas ($NF_3$), breaks the $NF_3$ down into fluorine radicals (and nitrogen) and supplies the fluorine radicals to the chamber 110. Typically, the remote microwave generator 212 is operated between about 1500 W to about 3000 W, and preferably between about 2000 W and 2500 W. The exemplary tungsten cleaning process is most efficient at a pressure of about 1.5 Torr. Accordingly, the chamber 110 is maintained at 1.5 Torr throughout the cleaning process (as described below).

Tungsten deposited on the interior chamber surfaces and on other components within the processing chamber 110 reacts with fluorine (F) radicals generated in the $NF_3$ plasma to form a gas known as tungsten hexafluoride ($WF_6$). Because tungsten hexafluoride formation is highly exothermic, heat is generated during chamber cleaning. If the pumping rate of the pressure control system 124 is not increased accordingly, the increased temperature would cause an increase in the pressure within the chamber 110. To maintain a constant chamber pressure, the throttle valve 216 of the pressure control system 124 is gradually opened wider (e.g., by stepping the stepper motor 240 in a first direction from a zero or closed position) to provide a higher exhaust rate and thus to relieve the increasing pressure within the chamber 110 due to tungsten hexaflouride formation. The reaction between tungsten and fluorine continues until all of the residual tungsten reacts with fluorine, and the cleaning operation is complete. As the cleaning operation nears completion, and the formation of tungsten hexafluoride gradually decreases, and to maintain a constant chamber pressure, the throttle valve 216 gradually closes (e.g., by stepping the stepper motor 240 in a second direction thus approaching the zero or closed position) to thus decrease the rate at which gas is pumped from the chamber 110.

Preferably, to perform the inventive endpoint detection method, the stepper motor 240 coupled to the throttle valve 216 has 800 positions or "steps", where about 100 steps represents a completely closed throttle valve, and 800 steps represents a completely open throttle valve. A controller containing software programmed to perform the inventive endpoint detection method (described below) is operatively coupled to the stepper motor 240. The existing controller 246 of the pressure control system 124 may be programmed with the inventive endpoint detection program, or an additional controller C (shown in phantom in FIG. 3) may be coupled to the stepper motor 240.

A program is used to perform the inventive endpoint detection method. The program product of the present invention comprises a memory or a carrier wave signal containing program code for performing endpoint detection according to one of the following two aspects of the invention. According to the first aspect, a calibration process (e.g., a cleaning process or some other process) is performed within the chamber 110 and the position of the throttle valve 216 is monitored so as to generate a calibration signal. For example, a dummy wafer is placed in the chamber 110 and a known thickness of material (e.g., titanium) is deposited on the dummy wafer. The dummy wafer is removed from the chamber 110, and the chamber 110 is cleaned while the throttle valve 216's position is monitored. Thus a calibration signal comprising a plurality of throttle valve positions during the chamber cleaning is obtained and is saved.

Thereafter, a production instance of the process is performed and the endpoint of the production process is estimated via the previously obtained calibration signal. According to the first aspect of the invention, the obtained calibration signal may simply indicate the time at which the throttle valve 216 undergoes its last step change (i.e., the endpoint time). Accordingly, the controller 246 (or C) may be programmed to signal the end of the production process when the endpoint time (as identified by the calibration signal) is reached. Because the actual endpoint of the production process may vary, it may be desirable to have the controller signal the end of the production process after an "over" endpoint time t+N. Processing for a period of time (e.g., 2 sec) after the estimated endpoint reduces the possibility of erroneously stopping the production process before its actual endpoint is reached.

In the second aspect of the inventive endpoint detection method, a calibration process is performed while the position of the throttle valve 216 is monitored to obtain a calibration signal as previously described. Noise is filtered from the calibration signal either as the signal is obtained, or subsequently thereto. A filtered calibration signal having one or more features is thereby created.

Thereafter a production instance of the process is performed while the position of the throttle valve 216 is monitored, and a production signal is thereby obtained. Noise is filtered from the production signal either as the signal is obtained, or subsequently thereto. A filtered production signal having one or more features is thereby created.

The endpoint of the production instance of the process then is estimated by comparing the one or more features of the filtered production signal with the one or more features of the calibration signal. For example, when the endpoint is reached the throttle valve position will remain stationary and a flat line feature within the production and calibration signals will result. Accordingly, when a flat line feature (which lasts for a given duration) is detected, the controller 246 may be programmed to signal that the endpoint of the production process has been reached. To avoid prematurely ending the production process, the controller 246 may be programmed so that the endpoint is signaled only if the flat line feature of a given duration occurs after a certain time period (e.g., a minimum endpoint time determined from the calibration signal). Alternatively, the controller 246 may be programmed to compare the production signal's pattern of features to the calibration signal's pattern of features and to signal endpoint when a certain level of correspondence between the two patterns occurs. The presently preferred method of filtering the signals and identifying features is described below with reference to the flow chart of FIGS. 5A and 5B.

Figure 5A:
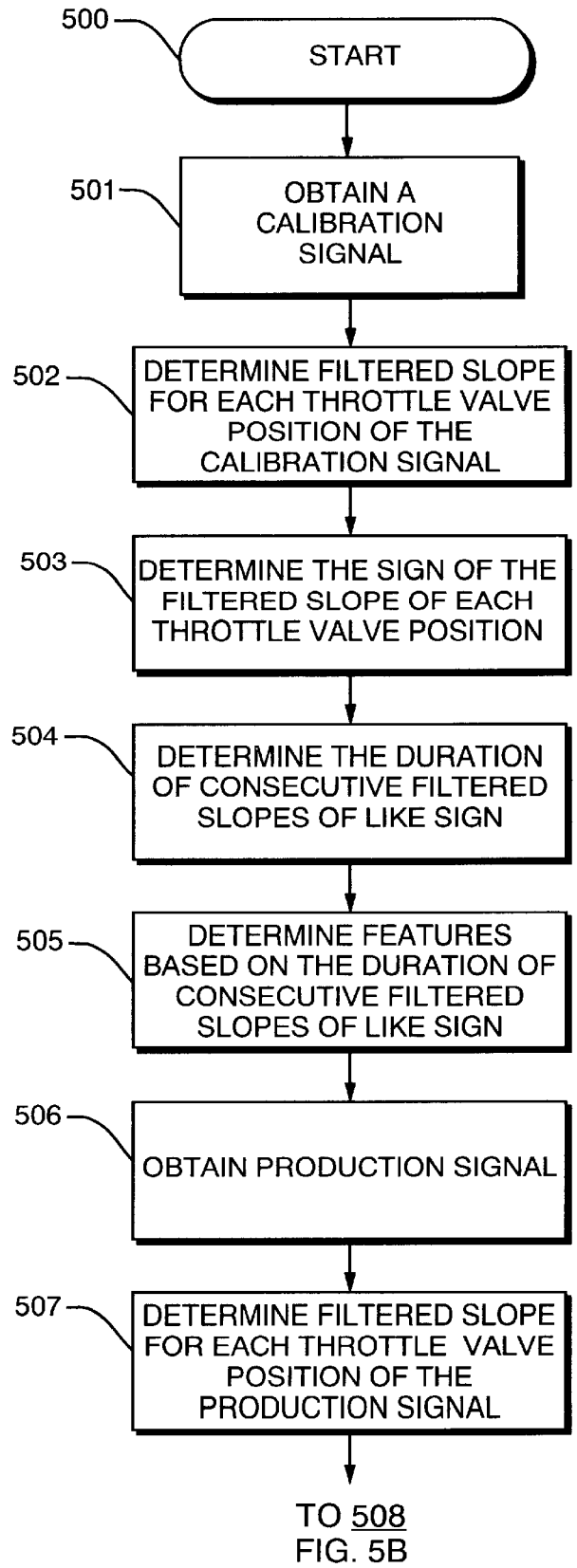
FIGS. 5A and 5B are a flow chart useful in describing the preferred embodiment of the invention.
Figure 5B:
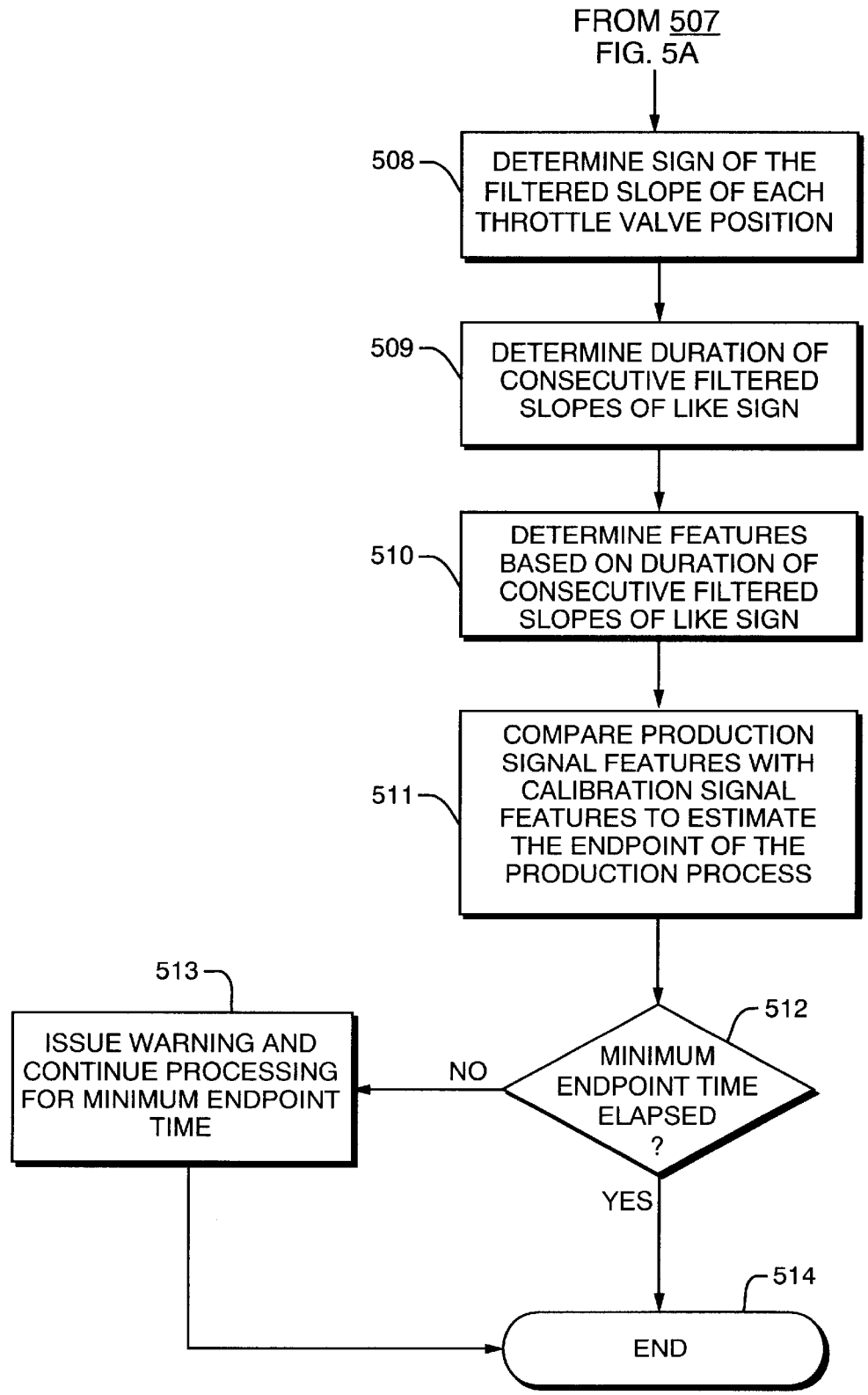

FIGS. 5A and 5B are a flow chart useful in describing the presently preferred computer program product of the inventive endpoint detection method. The program is carried by any computer readable medium, and thus may be stored in memory accessible by the controller 246 or by the controller C, transmitted to the controller 246 via a carrier wave signal from a remote computer (e.g., from a web server), etc.

With reference to FIGS. 5A and 5B, in Block 500 the inventive endpoint detection method is started. In Block 501 a calibration process is performed (e.g., a cleaning process) within the chamber 110 and a throttle valve position calibration signal is obtained by monitoring the position of the throttle valve 216 during the calibration process, as previously described. Thereafter, in Block 502, the calibration signal is filtered by first computing a filtered slope value for each throttle valve position. For example, assuming the calibration signal is generated by sampling throttle valve position at regular time intervals, the slope for each throttle valve position x(t) is computed via the formula:

$$x(t) = \frac{Tp(t) - Tp(t-1)}{\Delta t}$$

where Tp(t) equals the throttle valve position for which the slope is to be computed (i.e., the current throttle valve position), Tp(t−1) equals the previous throttle valve position and Δt equals the time interval between throttle valve measurements.

Once the slope x(t) for each throttle valve position is computed, the slopes are filtered, preferably via a finite impulse response filter of order three. Most preferably, a filtered slope y(t) for each throttle position is computed according to the formula:

$$y(t)=0.0471x(t)+0.0488x(t-1)+0.0488x(t-2)+0.0471x(t-3)$$

where x(t) equals the slope of the current throttle valve position and where x(t−n) equals the slope of the nth previous throttle valve position (e.g., x(t−1) equals the slope of the first previous throttle valve position, x(t−2) equals the slope of the second previous throttle valve position, etc.). A filtered calibration signal thereby is created comprising the filtered slopes.

In Block 503, the sign of each filtered slope of the calibration signal is determined. For example, if a filtered slope y(t) is between −0.200 and +0.200, the filtered slope sign is deemed "zero"; if the filtered slope is between −0.21 and negative infinity, the filtered slope sign is deemed "negative"; and if the filtered slope is between +0.21 and positive infinity, the filtered slope sign is deemed "positive" as shown in Table 1.

TABLE 1

| SLOPE SIGN | FILTERED SLOPE RANGE |
|---|---|
| Positive | +0.21 to +∞ |
| Zero | −0.2 to +0.2 |
| Negative | −0.21 to −∞ |

In Block 504, the number or "duration" of consecutive filtered slopes of like sign is determined, and in Block 505 a determination is made as to whether each duration of consecutive filtered slopes constitutes a feature. For example, if a pre-determined number of consecutive filtered slopes of like sign define a feature, each duration of consecutive filtered slopes of like sign comprising at least the pre-determined number is identified as a feature. Note that any duration of consecutive filtered slopes may be employed to identify a feature of a calibration or a production signal, although five is the presently preferred duration based on empirical data.

Features of a signal (e.g., a calibration signal, or production signal, etc.) are "recorded" by noting the sign of the feature and the duration of the feature. In the preferred embodiment, if a feature comprises five to seven consecutive filtered slopes of like sign, the feature is recorded by its sign and by its duration minus three; and if a feature comprises more than seven consecutive filtered slopes, the feature is recorded by its sign and by a duration of four. Each feature is treated as if it continues in duration until another feature is identified, and ant intermediary filtered slopes insufficient in duration to constitute a feature are ignored.

TABLE 2 shows exemplary filtered slope data for a calibration signal. The exemplary data comprises twenty-two data points that constitute three features:

1. a first feature of duration nine and having a negative slope, recorded as (−, 4) (e.g., the zero slopes at times five and six are insufficient in duration to constitute a feature and thus are ignored);
2. a second feature of duration five and having a positive slope, recorded as (+, 2); and
3. a third feature of duration six and having a zero slope, recorded as (0,3).

TABLE 2

| Time | Slope | Sign |
|---|---|---|
| 0 | −0.68 | − |
| 1 | −0.56 | − |
| 2 | −0.42 | − |
| 3 | −0.3 | − |
| 4 | −0.22 | − |
| 5 | 0.192 | 0 |
| 6 | 0.196 | 0 |
| 7 | −0.21 | − |
| 8 | −0.23 | − |
| 9 | −0.24 | − |
| 10 | −0.22 | − |
| 11 | +0.68 | + |
| 12 | +0.56 | + |
| 13 | +0.42 | + |
| 14 | +0.30 | + |
| 15 | +0.22 | + |
| 16 | 0.192 | 0 |
| 17 | 0.184 | 0 |
| 18 | 0.176 | 0 |
| 19 | 0.168 | 0 |
| 20 | 0.160 | 0 |
| 21 | 0.140 | 0 |

To detect endpoint via a calibration signal, preferably filtered slopes are collected until fifty consecutive filtered slopes each having a zero slope are measured (e.g., indicating, for example, that a cleaning process is complete because no further vaporized deposition residue is being released and the chamber pressure has stabilized). Proper endpoint detection thereby is ensured. The preferred endpoint time is determined by subtracting forty-eight throttle valve position measurement intervals from the total time required to measure the calibration signal containing the fifty consecutive filtered slopes. The preferred "minimum endpoint time" is ninety percent of the preferred endpoint time. Additionally, the last feature preferably is recorded as (0,2) rather than as (0,4) because at the time the last zero feature starts, the cleaning process has ended and is verified by waiting for two seconds thereafter.

In Block 506 a production instance of the process is performed (e.g., a cleaning process following a production fabrication process) and a throttle valve position production signal is measured by measuring the position of the throttle valve 216 during the production process. Thereafter, in Blocks 507–510, the filtered slope and sign for each throttle valve position, the duration of consecutive filtered slopes of like sign, and the features present within the production signal are determined in the same manner that these parameters are obtained for the calibration signal (e.g., Blocks 502–505).

In Block 511, the production signal features are compared to the calibration signal features to estimate the endpoint of the production process. Specifically, the production signal is examined for each feature identified within the calibration signal. When the duration of consecutive filtered slopes of a particular sign identified within the first feature of the calibration signal are found within the production signal, the production signal then is examined for the second feature of the calibration signal (e.g., by looking for a feature having the appropriate filtered slope of the appropriate duration and sign). This process preferably is repeated for each feature identified within the calibration signal. Once the appropriate number of features having the appropriate filtered slopes of appropriate duration and sign (as set by the calibration signal) is found within the production signal, the endpoint of the production process is estimated to have been reached. Preferably, determination of production signal features and comparison of the production signal with the stored calibration signal occurs as the production signal is measured (e.g., in real time).

In Block 512, assuming the requisite calibration signal features have been found within the production signal, a determination is made as to whether the minimum endpoint time has elapsed. If the minimum endpoint time has not elapsed, a processing error warning is issued, the production process is continued until the minimum endpoint time is reached (Block 513) and the production process then is terminated (Block 514); otherwise, if the minimum endpoint time has been reached, no processing error warning is issued and the production process is terminated in Block 514.

The foregoing description discloses only the preferred embodiments of the invention, modifications of the above disclosed apparatus and method which fall within the scope of the invention will be readily apparent to those of ordinary skill in the art. For instance, the method for filtering noise from the calibration and production signals is merely preferred and other filtering techniques known in the art may be employed. Similarly, the slope ranges for determining slope sign are merely preferred, as are the number of filtered slopes per feature and the method for recording feature information. Other slope ranges, numbers of filtered slopes per feature and methods for recording feature information may be used. It is also possible to use only the last non-zero slope feature to detect endpoint (rather than detecting each slope feature) by monitoring throttle valve position for the last non-zero feature and by ending the process when the last non-zero feature ends. The minimum endpoint time varies with process type and processing chamber variations, and a maximum endpoint time also may be employed to limit production process times.

Accordingly, while the present invention has been disclosed in connection with the preferred embodiments thereof, it should be understood that other embodiments may fall within the spirit and scope of the invention, as defined by the following claims.

The invention claimed is:

1. A method of endpoint detection, comprising:

performing a calibration instance of a process in a chamber;

monitoring the position of a throttle valve during performance of the calibration process in the chamber to obtain a calibration signal;

performing a production instance of the process in the chamber; and estimating the endpoint of the production process via the calibration signal;

wherein the calibration signal indicates the endpoint of the calibration process occurs at an endpoint time (t); and wherein estimating the endpoint of the production process via the calibration signal comprises equating the endpoint time (t) with the endpoint of the production process.

2. The process of claim 1 further comprising:

performing the production process in the chamber for an over endpoint time.

3. A method of endpoint detection, comprising:

performing a calibration instance of a process in a chamber;

monitoring the position of a throttle valve during performance of the calibration process in the chamber to obtain a calibration signal;

performing a production instance of the process in the chamber; and estimating the endpoint of the production process via the calibration signal, said estimating including monitoring the position of the throttle valve during performance of the production process to obtain a production signal;

wherein:

monitoring the position of a throttle valve during performance of the calibration process in the chamber to obtain a calibration signal comprises:

filtering noise from the calibration signal to create a filtered calibration signal having a plurality of features; and wherein monitoring the position of the throttle valve during performance of the production process in the chamber to obtain a production signal comprises:

filtering noise from the production signal to create a filtered production signal having a plurality of features; and wherein estimating the endpoint of the production process via the calibration signal comprises comparing one or more features of the calibration signal with one or more features of the production signal.

4. The method of claim 3 wherein filtering noise from the calibration signal comprises determining a filtered slope for each throttle valve position within the calibration signal; and wherein filtering noise from the production signal comprises determining a filtered slope for each throttle valve position within the production signal.

5. The method of claim 4 wherein determining a filtered slope for each throttle valve position comprises computing a filtered slope y(t) for each throttle valve position, according to the formula:

$$y(t)=0.0471x(t)+0.0488x(t-1)+0.0488x(t-2)+0.0471x(t-3)$$

where x(t) equals the slope of the current throttle valve position, and where x(t−n) equals the slope of the nth previous throttle valve position.

6. The method of claim 4 further comprising for the filtered calibration signal:

determining the sign of the filtered slope of each throttle valve position;

determining the duration of consecutive filtered slopes of like sign; and determining features based on the duration of consecutive filtered slopes of like sign; and for the filtered production signal:

determining the sign of the filtered slope of each throttle valve position;

determining the duration of consecutive filtered slopes of like sign; and determining features based on the duration of consecutive filtered slopes of like sign.

7. The method of claim 6 further comprising:

comparing the filtered production signal with the filtered calibration signal; and determining the endpoint of the production process when the number, order and signs of the filtered production signal's features equal the number, order and signs of the filtered calibration signal's features.

8. The method of claim 7 further comprising continuing the production process for a period of time after the endpoint of the production process is determined.

9. The method of claim 6 further comprising determining a zero filtered slope when the filtered slope falls within a predetermined range of positive and negative values.

10. The method of claim 3 wherein filtering noise from the calibration signal and filtering noise from the production signal comprise using a low pass filter of order three.

11. The method of claim 10 wherein filtering noise from the calibration signal and filtering noise from the production signal comprise using a finite impulse response filter.

* * * * *